(12) United States Patent
Hackl

(10) Patent No.: US 10,788,562 B2
(45) Date of Patent: Sep. 29, 2020

(54) METHODS AND DEVICES FOR TESTING THE FUNCTION OF AN INSULATION MONITORING DEVICE

(71) Applicant: Bender GmbH & Co. KG, Gruenberg (DE)

(72) Inventor: Dieter Hackl, Fernwald (DE)

(73) Assignee: BENDER GMBH & CO. KG, Gruenberg (DE)

(*) Notice: Subject to any disclaimer, the term of this patent is extended or adjusted under 35 U.S.C. 154(b) by 0 days.

(21) Appl. No.: 16/566,104

(22) Filed: Sep. 10, 2019

(65) Prior Publication Data

US 2020/0072935 A1 Mar. 5, 2020

Related U.S. Application Data

(62) Division of application No. 15/486,396, filed on Apr. 13, 2017, now Pat. No. 10,605,886.

(30) Foreign Application Priority Data

Apr. 27, 2016 (DE) .................... 10 2016 207 197

(51) Int. Cl.
*G01R 35/00* (2006.01)
*G01R 27/18* (2006.01)
*G01R 27/02* (2006.01)
*G01R 31/12* (2020.01)
*G01R 31/50* (2020.01)

(52) U.S. Cl.
CPC ............ *G01R 35/00* (2013.01); *G01R 27/025* (2013.01); *G01R 27/18* (2013.01); *G01R 31/1272* (2013.01)

(58) Field of Classification Search
CPC ....... G01R 35/00; G01R 27/025; G01R 27/18; G01R 31/1272
See application file for complete search history.

(56) References Cited

U.S. PATENT DOCUMENTS 4,214,311 A * 7/1980 Nakashima .......... G01R 27/025
324/541
2008/0157780 A1* 7/2008 Beeman ............... G01R 31/083
324/529

(Continued)

*Primary Examiner* — Tung X Nguyen
*Assistant Examiner* — Feba Pothen
(74) *Attorney, Agent, or Firm* — King & Schickli, PLLC

(57) ABSTRACT

Methods and devices are provided for testing the function of a standard insulation monitoring device, installed in an ungrounded power supply system, during operation. The basic concept of the invention rests upon adding a testing apparatus to the ungrounded power supply system, which is being monitored using an insulation monitoring device according to regulations, between the active conductors of an ungrounded power supply system and ground, said testing apparatus systematically changing an insulation resistance of the ungrounded power supply system and observing the reaction of the insulation monitoring device in a fully automated manner in perpetually repetitive testing cycles. The power supply system is monitored perpetually during its operation. In the method, the current operating state (insulation level, load state) of the power supply system is detected via network parameters, such as insulation resistance and system leakage capacity, and consulted for assessing the functionality of the insulation monitoring device.

5 Claims, 5 Drawing Sheets

(56) References Cited

U.S. PATENT DOCUMENTS

Figure 1B:
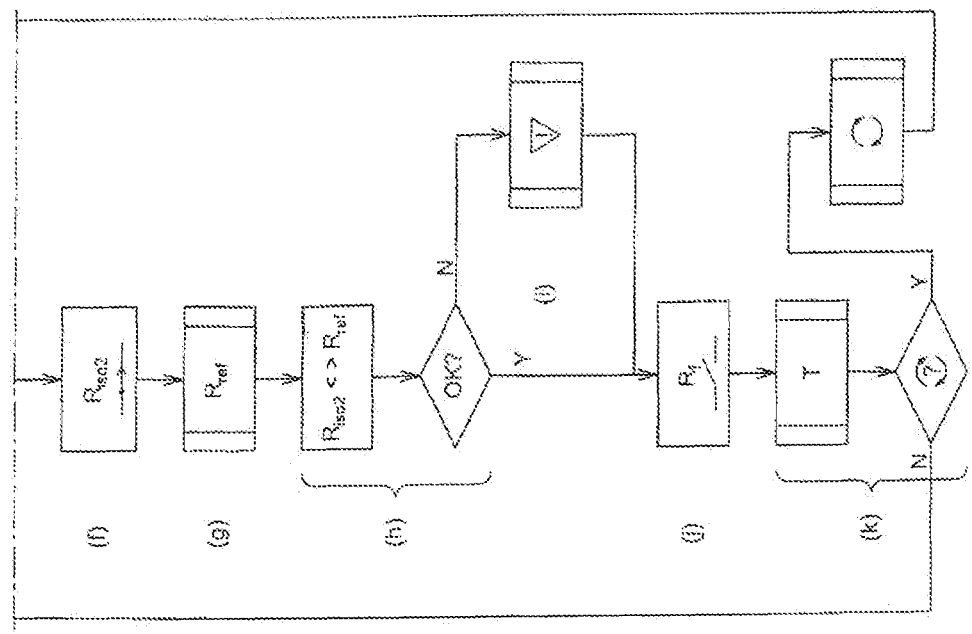

| | | | |
|---|---|---|---|
| 2010/0244849 A1* | 9/2010 | Yano | G01R 31/50 324/510 |
| 2015/0204937 A1* | 7/2015 | Lehr | G01R 31/1272 324/551 |
| 2015/0309106 A1* | 10/2015 | Machida | G01R 31/52 324/509 |

* cited by examiner

Fig. 3b
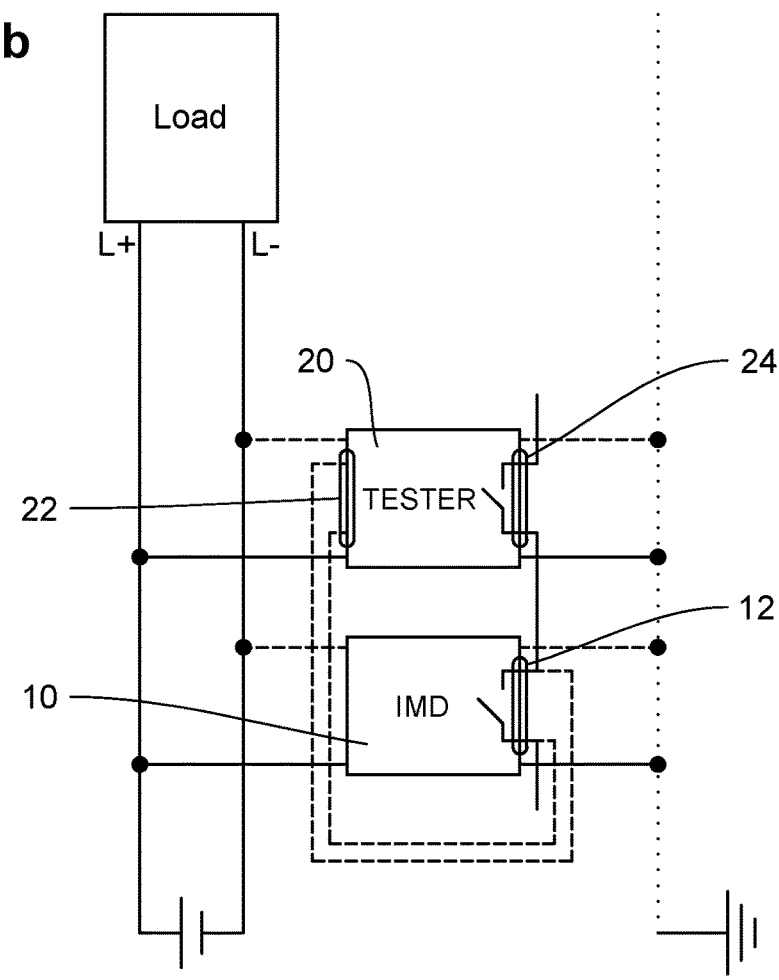
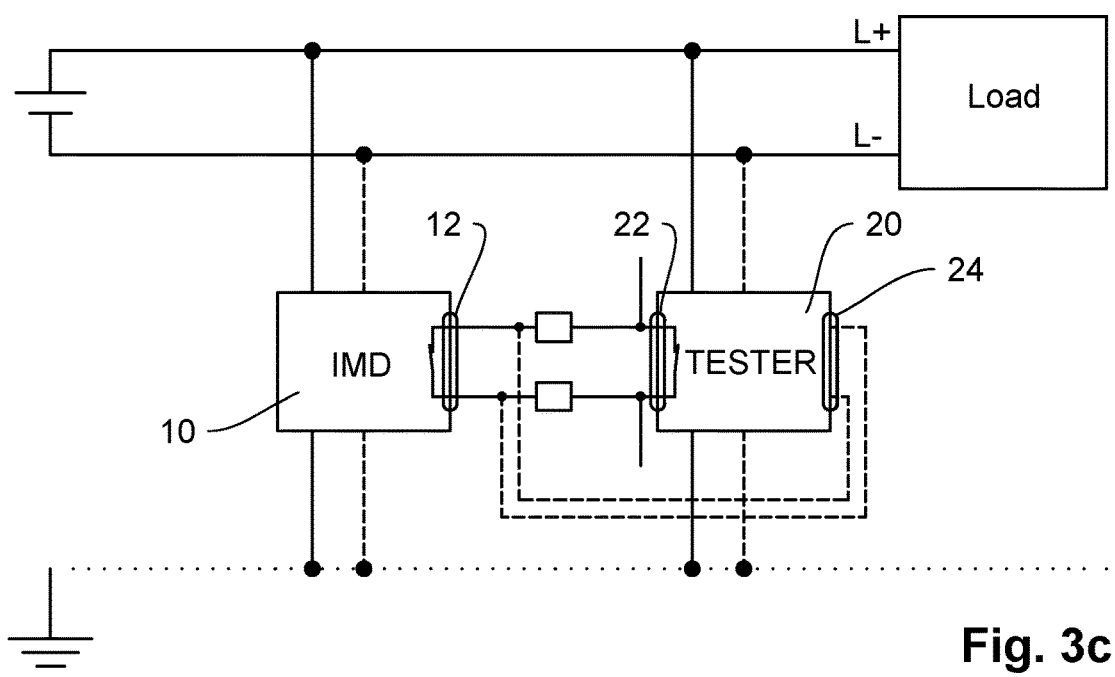
Fig. 3c

METHODS AND DEVICES FOR TESTING THE FUNCTION OF AN INSULATION MONITORING DEVICE

This application is a divisional of U.S. application Ser. No. 15/486,396, which claims the benefit of German Patent Application No. 10 2016 207 197.1, filed Apr. 27, 2016, the disclosures of which are incorporated herein by reference.

TECHNICAL FIELD

The invention relates to methods and devices for testing the function of a standard insulation monitoring device, installed in an ungrounded power supply system, during operation.

BACKGROUND

For supplying power to electric operating equipment, the network configuration of an ungrounded (IT) power supply system (from French isolé terre) is used when it comes to higher requirements in operational, fire and contact safety. In this type of power supply system, the active parts of the electric installation are separated from the ground potential.

Via the inherent safety of the ungrounded power supply system, a perpetual power supply of the appliances supplied by the ungrounded power supply system, i.e. the operating equipment connected to the ungrounded power supply system, can thus be ensured even if a first insulation fault occurs.

This presupposes that in the network to be monitored the resistance from active conductors of the power supply system to ground (insulation resistance—also called insulation fault resistance or fault resistance in the event of a fault) will have to be constantly monitored since a fault loop could arise via a possible further fault at another active conductor (second fault) and the flowing fault current in conjunction with an overcurrent protective device would result in the installation having to be shut down, leading to an operational standstill.

For monitoring the insulation of ungrounded power supply systems, insulation monitoring devices (IMDs) are used whose requirements are defined in the international standard IEC 61557-8.

However, there are applications, in particular in conjunction with using converters in the megawatt power range, in which high fault currents can flow via paths upon a first fault occurring, these paths not being designed for such high currents. This can result in operating states dangerous to persons and the installation so that the power supply is to be automatically shut down in the first fault instance. The power supply system is shut down by the insulation monitoring device by means of a shut-down signal sent to the alarm output of the insulation monitoring device.

This examination shows that higher demands to reliability are to be made to the usage of an insulation monitoring device regarding the modes of application described above. Similar to known protective devices, such as residual current protective devices (RCDs), a periodic monitoring of the function of the insulation monitoring device is required for ensuring that the installation is shut down reliably in the event of a fault.

Presently, a periodic monitoring of the insulation monitoring device is often only carried out within the scope of a mandatory repeat test of the power supply system, mostly partly automated using an installation testing device or a (self-made) testing apparatus, such as test fault resistances added via a relay.

Installation testing apparatuses known from the state of the art, e.g. from the company Benning temporarily add a fault resistance from an active conductor to ground and log the behavior of the insulation monitoring device to be tested. However, the testing operation must be triggered via manual entries and be monitored by the user. Moreover, the installation testing apparatuses for the partly automated testing of insulation monitoring devices are generally unsuitable for power supply systems ranging over a nominal voltage of 400 V and do not make enough provisions for the specific application.

When the insulation monitoring device is tested solely manually, the user either adds a suitable fault resistance to the energized power supply system from an active conductor to ground or the installation has to be repeatedly shut down and rebooted during testing in order to be able to add and remove the fault resistances without any danger. These modes of procedure are either very dangerous for personnel or so time-consuming when being executed that a test remains undone.

Simple, partly automated testing apparatuses used in practice, either made by the installation operator or acquired externally, pose another threat. These testing apparatuses generally consist of the following elements: test resistance, electromechanical switch (relay, contactor) and a switch or a push-button.

Should the test fault resistance be added via a test button, this button must be pressed down over a sufficient amount of time depending on the installation, the operational state and the insulation monitoring device put to use. In consequence, it is often preferred to provide a switch instead of a button, said switch maintaining its flipped position and adding the test fault resistance to ground from the active conductor as long as the switch is not flipped back. These solutions are potentially dangerous since there is a risk of the switch not being flipped again or at least not on time for removing the test fault resistance. The power supply system would then be operated too long or even constantly using a first fault. Should the used testing apparatus not be constructed for the overvoltage occurring in this process, damage to persons and property can arise due to fire hazards during this constant testing operation.

There is no product standard for partly automated, permanently installed testing apparatuses for testing the function of the insulation monitoring devices, which is why the installation operator has to assess the risks of each solution under their own responsibility.

When using a self-made or externally acquired, partly automated and permanently installed testing apparatus—which still requires manual inputs—, testing many different operating states of the installation only becomes possible with great effort in order to be able to provide well-founded information on the reliable function of the insulation monitoring device.

In most applications, testing the function of the insulation monitoring device by externally inserting a fault resistance in the installation is omitted.

Another disadvantage when using installation testing apparatuses as well as when conducting a solely manual test is that only exactly one current operational state of the power supply system to be monitored is tested during the testing period. Information regarding the monitoring reliability in other system states can only be provided when employing a much greater effort during testing.

As an alternative measure to this, the functionality of the insulation monitoring device is tested by means of a self-test by manually actuating the test button on the insulation monitoring device. Malfunctions of functional groups in the insulation monitoring device are detected via this internal testing in the device. Some devices can also be set up to actuate the alarm relays within the scope of the manually started self-test in order to establish their switching functionality.

A part of the tests conducted during the manual self-test are automatically repeated in some insulation monitoring testing devices, e.g. every 24 hours. Separate alarm outputs for device faults are usually available in these devices.

The installed self-test function, however, cannot test whether interference voltage components existing between the monitored ungrounded power supply system and ground are systemically interfering with the insulation monitoring that strongly so that the task of monitoring insulations cannot be conducted sufficiently reliably.

It can be said, therefore, that there is no economically feasible solution for monitoring whether an insulation monitoring device sufficiently fulfills the monitoring function during all operational states with respect to the specific application. There is a risk, in particular regarding a cost pressure arising from the application, of insulation monitoring devices being put to use which comprise considerable monitoring gaps.

The object of the present invention is therefore to propose a method and a testing device for testing the function of a standard insulation monitoring device installed in an ungrounded power supply system, the operational requirements of the insulation monitoring device related to the application being automatically considered so that providing well-founded information in regard of the reliability of the insulation monitoring device's function becomes possible.

SUMMARY

The object is attained by a first method according to the invention.

The basic concept of the invention rests upon adding a testing apparatus to the ungrounded power supply system, which is being monitored using an insulation monitoring device according to regulations, between the active conductors of the ungrounded power supply system and ground, said testing apparatus systematically changing an insulation resistance of the ungrounded power supply system and observing the reaction of the insulation monitoring device in a fully automated manner in perpetually repetitive testing cycles. The power supply system is monitored perpetually during its operation with the time gap, in which the testing cycle can be repeated, being variable. The test result can be logged, be sent to a superordinate system via interfaces or trigger an alarm message when a faulty function of the insulation monitoring device is suspected. In critical cases, shutting down the power supply can be considered in order to prevent any risk of danger.

In the method, the current operating state (insulation level, load state) of the power supply system is detected via network parameters such as insulation resistance and system leakage capacity and consulted for assessing the functionality of the insulation monitoring device.

A risk to users, as can occur in manually conducted repeat tests or by self-made or externally acquired testing apparatuses, which are questionable regarding their safety and are not subject to product standards, is prevented by the method according to the invention.

It is presumed that the insulation monitoring device to be monitored and the testing apparatus controlling the insulation monitoring device communicate with each other in this first method, meaning data is transmitted between these two devices.

A first insulation resistance of the ungrounded power supply system is initially measured by the insulation monitoring device.

This first measuring value of the insulation resistance is transmitted to the testing apparatus and saved there.

Starting from the first insulation resistance value and considering further parameters such as nominal mains voltage, system leakage capacity, response value and response time, the testing apparatus calculates an uncritical test fault resistance value. The further parameters can be transmitted to the testing apparatus and/or be separately deposited there in conjunction with the first insulation fault value. The uncritical test fault resistance value represents a resistance value adjusted to the current operational requirements of the power supply system, said resistance value—added parallel to the first insulation resistance value—not being intended to trigger an alarm message via the insulation monitoring device.

A test fault resistance comprising this uncritical resistance value is then added between one of the active conductors of the ungrounded power supply system and ground via the testing apparatus and is therefore parallel to the first insulation resistance measured before.

Subsequently, a second insulation resistance of the ungrounded power supply system is measured by the insulation monitoring device, said second insulation resistance resulting from the first insulation resistance and the test fault resistance added parallel thereto.

This second insulation resistance value is also transmitted to the testing apparatus, saved there and compared to a comparative insulation resistance value calculated by the testing apparatus from the first insulation resistance value and the test fault resistance value added parallel thereto. The result from this comparison is logged in a result log and can be read and transmitted via a suitable communication interface.

Should the comparison reveal that the second insulation resistance measured by the insulation monitoring device deviates from the calculated comparative insulation resistance value, which could indicate a faulty function of the insulation monitoring device, the testing apparatus triggers an alarm message.

By removing the test fault resistance via the testing apparatus, the current testing cycle is terminated and repeated after a predetermined period of time.

An embodiment of this first method relates to an arrangement, in which the testing apparatus is a functional component of a further insulation monitoring device. In this case, this further insulation monitoring device can take over the task of insulation monitoring in the ungrounded power supply system when a faulty function of the already installed insulation monitoring device occurs.

A further embodiment of the method can be applied if the testing apparatus is a functional component of a further insulation monitoring device and the already installed insulation monitoring device also comprises a testing apparatus as a functional component. Thus, two equal functional insulation monitoring devices are in operation, which each comprises a testing apparatus besides their insulation monitoring function.

In this case, the two insulation monitoring devices can alternately take over the task of insulation monitoring and the task of testing the function of the other insulation monitoring devices. Should the already installed insulation monitoring device be deemed unreliable by the testing apparatus of the further insulation monitoring device, the device function is swapped in such a manner that the further insulation monitoring device takes over monitoring insulations and is controlled by the testing apparatus of the already installed insulation monitoring device. In this manner, the installation can be brought to a safe operating state by the further insulation monitoring device when falling below a critical insulation resistance level even when the already installed insulation monitoring device has a faulty function.

The device function can either be swapped centrally by a controlling management system or, should there be no superordinate management system, via a timer running synchronized in both devices.

Furthermore the task is attained by a second method according to the following invention.

The concept of this method also rests upon adding a testing apparatus to the ungrounded power supply system, which is being monitored using an insulation monitoring device according to regulations, between the active conductors of an ungrounded power supply system and ground, said testing apparatus systematically changing an insulation resistance of the ungrounded power supply system and observing the reaction of the insulation monitoring device in a fully automated manner in perpetually repetitive testing cycles. However, it is presumed that the insulation monitoring device to be tested and the testing apparatus controlling the insulation monitoring device do not communicate with each other in this second embodiment so that no data is transmitted between these two devices.

The testing apparatus therefore must be familiar with the current parameters of the insulation monitoring device and the power supply system required for assessing the functionality of the insulation monitoring device.

For this purpose, an internal resistance value of the insulating monitoring device, a response value set in the insulation monitoring device for the insulation resistance and a maximum permissible response time set in the insulation monitoring device are deposited in the testing apparatus.

In a first step of the testing cycle, the testing apparatus measures an effective insulation resistance, which results from the internal resistance of the active insulation monitoring device and an insulation resistance of the ungrounded power supply system added parallel thereto.

The testing apparatus calculates an insulation resistance value of the ungrounded power supply system from the measured effective insulation resistance value and the deposited internal resistance value of the insulation monitoring device, a critical test fault resistance value being able to be calculated on the basis of said insulation resistance value. This critical test fault resistance value is determined in such a manner that it is supposed to trigger a system alarm message in the insulation monitoring device when considering the known response value.

The test fault resistance is added between at least one of the active conductors of the ungrounded power supply system and ground via the testing apparatus, a time measuring device for measuring a response time of the insulation monitoring device being started simultaneously and a system alarm output of the insulation monitoring device being monitored by the testing apparatus.

Should an unexpected alarm be signaled via the system alarm output and should the measured response time exceed the maximum permissible response time, the testing apparatus initiates a fault treatment.

Should an alarm be transmitted to the system alarm output within the maximum permissible response time, this is then recorded in the form of a result log and/or by transmitting the test results to a management system.

The testing cycle is terminated by removing the test fault resistance.

In another embodiment of the method, one or more of the following actions is carried out by the testing apparatus as a fault treatment when the maximum permissible response time is exceeded: logging the fault; transmitting a fault message to a superordinate management system; dispatching a—preferably optical and/or acoustical—function alarm message.

Since triggering a system alarm of the insulation monitoring device is absolutely mandatory in the second method in order to asses its functionality, it is necessary to be able to differentiate an actual system alarm of the insulation monitoring device from a system alarm of the insulation monitoring device triggered due to testing. For this reason, an effective system alarm is provided by uncoupling the system alarm output of the insulation monitoring device in such a manner that the system alarm triggered by the insulation monitoring device only becomes effective if the system alarm triggered by the insulation monitoring device was not triggered by a testing cycle.

The object of the invention is furthermore attained by a testing apparatus, which conducts the first method according to the invention.

For this purpose, the testing apparatus comprises a controlling and calculating unit having a storage device for conducting the fully automated, perpetually running test cycle. The controlling and calculating unit controls the operation of the method steps in the test cycle and conducts the calculations.

A communication device serves for transmitting data, a data connection being provided to the insulation monitoring device and communication with a superordinate management system being possible. Actions corresponding to the procedure of the test cycle are also triggered on the insulation monitoring device via the communication channel established between the insulation monitoring device and the testing apparatus. The communications device can also comprise providing a test alarm signal.

A switching device enables adding the test fault resistance between at least one active conductor of the ungrounded power supply system and ground.

An alarm message is triggered using a test alarm apparatus in the event that a faulty function of the insulation monitoring device is detected.

The object of the invention is further attained by a testing apparatus, which conducts the second method according to the invention.

The testing apparatus in this embodiment also comprises a controlling and calculating device having a memory device for conducting the fully automated, perpetually running testing cycle. Since the insulation monitoring device and the testing apparatus do not directly communicate with each other—indirect communication being able to be provided via a superordinate management system—, the actions conducted during the operation of the testing cycle only concern the testing apparatus itself.

Furthermore, the testing apparatus in this embodiment comprises a measuring device for measuring the insulation resistance effective in the ungrounded power supply system. Contrary to the testing apparatus conducting the first method, the testing apparatus in this embodiment measures the (effective) insulation resistance itself in order to determine the critical test fault resistance value on the basis of the effective insulation resistance value.

A switching device enables adding and removing the test fault resistance between at least one active conductor of the ungrounded power supply system and ground.

Furthermore, the testing apparatus in this embodiment comprises a monitoring input for monitoring a system alarm output of the insulation monitoring device. With the aid of the monitoring input in conjunction with the system alarm output of the insulation monitoring device, it can be ensured that the system alarm triggered by the insulation monitoring device only becomes effective if the system alarm triggered by the insulation monitoring device was not triggered by a testing cycle.

The object of the invention is further attained by an insulation monitoring device for monitoring an insulation resistance of an ungrounded power supply system which comprises a testing apparatus.

Advantageously, the range of functions of an insulation monitoring device corresponding to the requirements of the international standard IEC 61557-8 can be amended by integrating a testing apparatus n. For this purpose, the testing apparatus represents a functional block within the standardized insulation monitoring device so that the installation operator does not have to conduct a separate risk consideration regarding the potential effects of an additionally added (test) fault resistance.

Using two insulation monitoring devices amended with the testing function in parallel with each other is particularly advantageous since these devices can alternately take over the task of insulation monitoring and the task of testing the function of the other device.

By using a standard insulation monitoring device having a testing function, the expenditure of considering risks when using a non-standard testing apparatus and the expenditure of conducting tests for its technical acceptance are avoided.

BRIEF DESCRIPTION OF THE DRAWING FIGURES

Further advantageous embodiments can be taken from the following description and the drawing, which describe preferred embodiments of the invention by way of examples. In the figures, FIGS. 1a, 1b show a flow chart of the first method according to the invention, FIGS. 2a, 2b show a flow chart of the second method according to the invention and FIGS. 3a, 3b, 3c and 3d show arrangements of the uncoupling of the system alarm output of the insulation monitoring device.

DETAILED DESCRIPTION

Figure 1A:
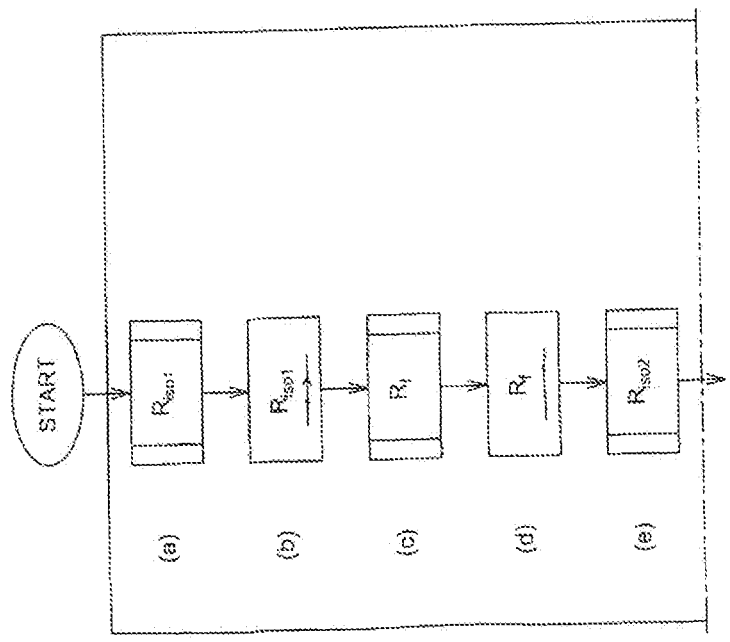
Figure 2A:
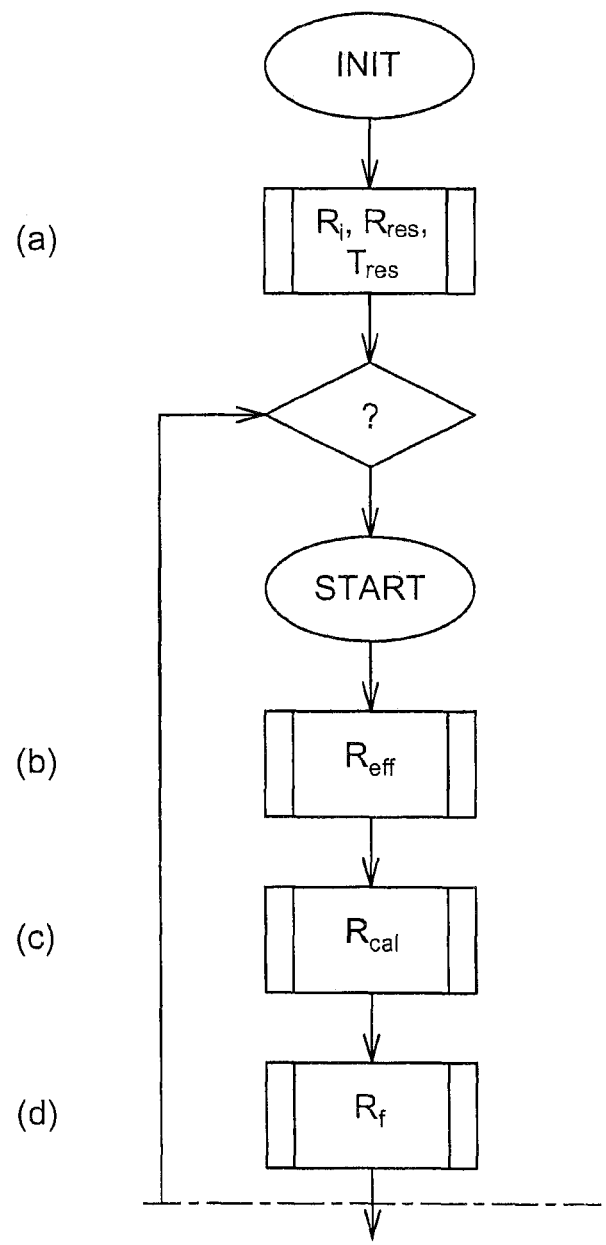
Figure 2B:
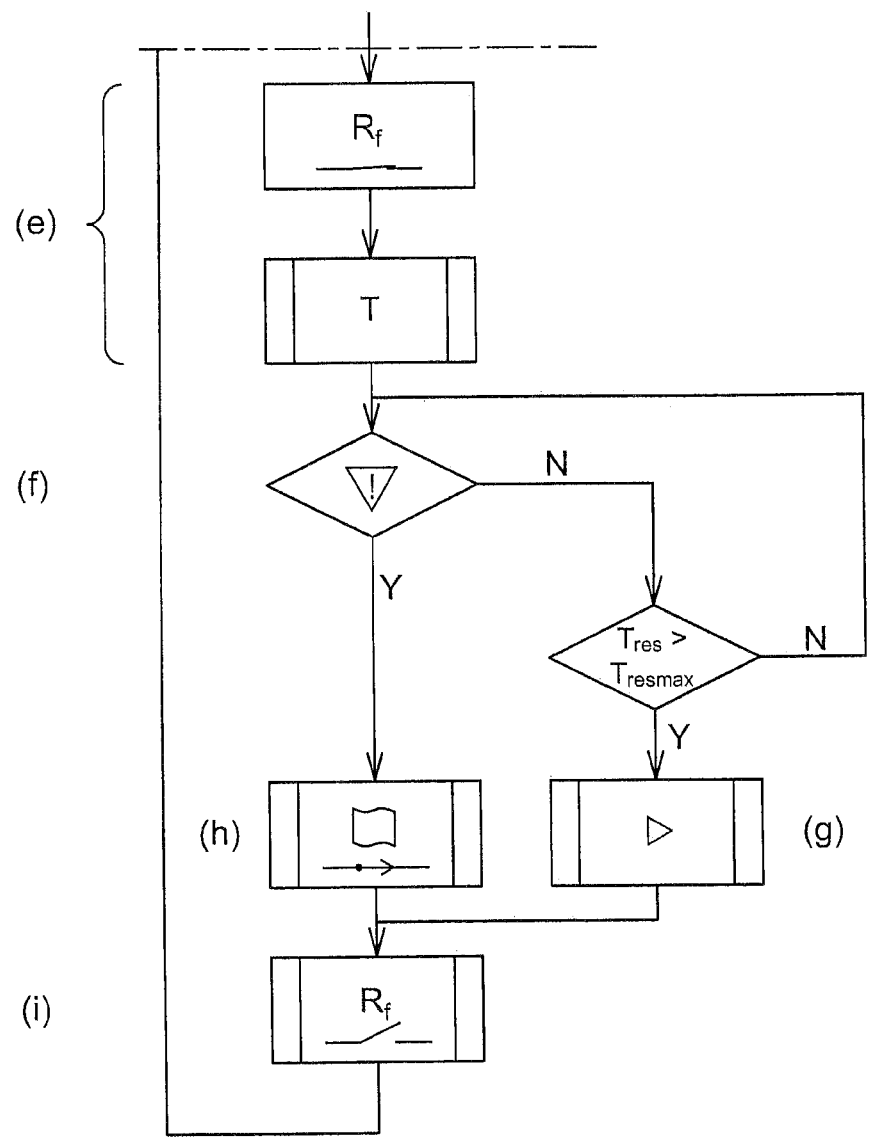

FIGS. 1a and 1b show a flow chart of the first method according to the invention, said method being characterized by data being transmitted between the insulation monitoring device 10 (FIGS. 3a to 3c) to be tested and the testing apparatus 20 (FIGS. 3a to 3c) controlling the insulation monitoring device.

Each method step is described individually:

(a) measuring a first insulation resistance Riso1 of the ungrounded power supply system via the insulation monitoring device 10, (b) transmitting the first insulation fault resistance value to the testing apparatus and saving the first insulation resistance value Riso1 in the testing apparatus 20, (c) calculating an uncritical test fault resistance value Rf via the testing apparatus 20, (d) adding the uncritical test fault resistance Rf between at least one of the active conductors of the ungrounded power supply system and ground via the testing apparatus 20, (e) measuring a second insulation resistance Riso2 of the ungrounded power supply system via the insulation monitoring device 10, said second insulation resistance Riso2 resulting from the first insulation resistance Riso1 and test fault resistance Rf added parallel thereto, (f) transmitting the second insulation fault value Riso2 to the testing apparatus 20 and saving the second insulation resistance value Riso2 in the testing apparatus 20, (g) calculating a comparative insulation resistance value Rref via the testing apparatus 20 from the first insulation fault value Riso1 and the test fault resistance value Rf added parallel thereto, (h) comparing the insulation resistance Riso2 measured by the insulation monitoring device 20 to the comparative insulation resistance value Rref calculated by the testing apparatus 20 in the testing apparatus 20 and generating a result log, (i) activating an alarm message via the testing apparatus 20, should the comparison result in the second insulation resistance Riso2 measured by the insulation monitoring device 10 deviating from the calculated comparative insulation resistance value Rref, said deviation indicating a faulty function of the insulation monitoring device 10, (j) removing the test fault resistance Rf via the testing apparatus 20.

In an amended embodiment, it is presupposed that two insulation monitoring devices (10) are provided with the testing function—for testing the function of the other insulation monitoring device (10)—so that the following additional step can be conducted when reliability requirements are heightened:

(k) switching the device function after a timer, which runs in sync in both insulation monitoring devices, has run out.

FIGS. 2a and 2b show a flow chart of the second method according to the invention, in which data, when compared to the first method, is not directly transmitted between the insulation monitoring device 10 (FIGS. 3a to 3c) to be tested and the testing apparatus 20 (FIGS. 3a to 3c) controlling the insulation monitoring device.

In an initializing step, the following takes place:

(a) depositing the following in the testing apparatus 20: an internal resistance value Ri of the insulation monitoring device 10, a response value Rres set in the insulation monitoring device 10 and a maximum permissible response time Tresmax set in the insulation monitoring device 10 if the insulation monitoring device is supposed to be tested, the following method steps will subsequently take place in a perpetually running testing cycle:

(b) measuring an effective insulation resistance Reff via the testing apparatus, said effective insulation resistance Reff resulting from the internal resistance Ri of the active insulation monitoring device and an insulation resistance Riso of the ungrounded power supply system arranged parallel thereto, (c) calculating an insulation resistance value Rcal of the ungrounded power supply system via the testing apparatus from the effective measured insulation resistance value Reff and the deposited internal resistance value Ri of the insulation monitoring device, (d) calculating a critical test fault resistance value Rf via the testing apparatus 20 while considering the calculated insulation resistance value Rcal of the ungrounded power supply system, (e) adding the test fault resistance Rf via the testing apparatus between one of the active conductors of the ungrounded power supply system and ground and simultaneously starting a time measuring device in the testing apparatus 20 for measuring a response time Tres of the insulation monitoring device 10, (f) monitoring a system alarm output of the insulation monitoring device and measuring the response time Tres via the testing apparatus, (g) starting a fault treatment via the testing apparatus, should the measured response time Tres exceed the maximum permissible response time Tresmax, (h) generating a result log and/or transmitting the test result to a management system, should the measured response time Tres not exceed the maximum permissible response time Tresmax, meaning an alarm was triggered according to the function, (i) removing the test fault resistance Rf via the testing apparatus 20.

Figure 3A:
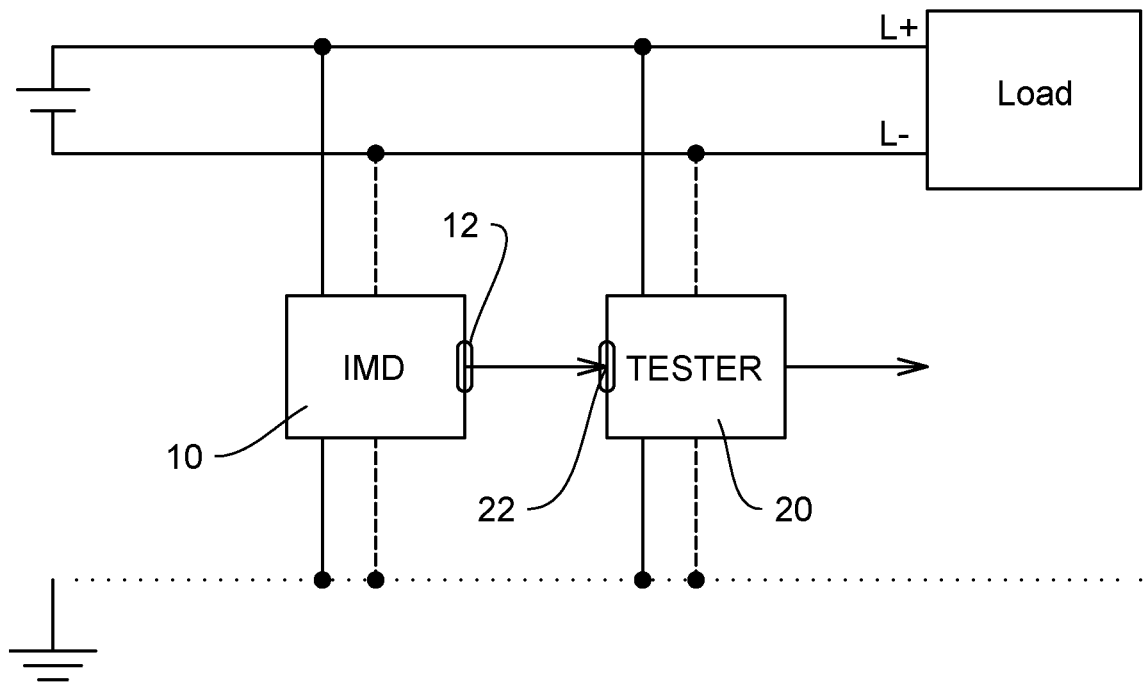

FIGS. 3a to 3c show different possibilities of uncoupling the system alarm output 12 of the insulation monitoring device 10 in order to be able to ensure that the system alarm triggered by the insulation monitoring device 10 only becomes effective if the triggered system alarm was not triggered by a testing cycle.

Figure 3D:
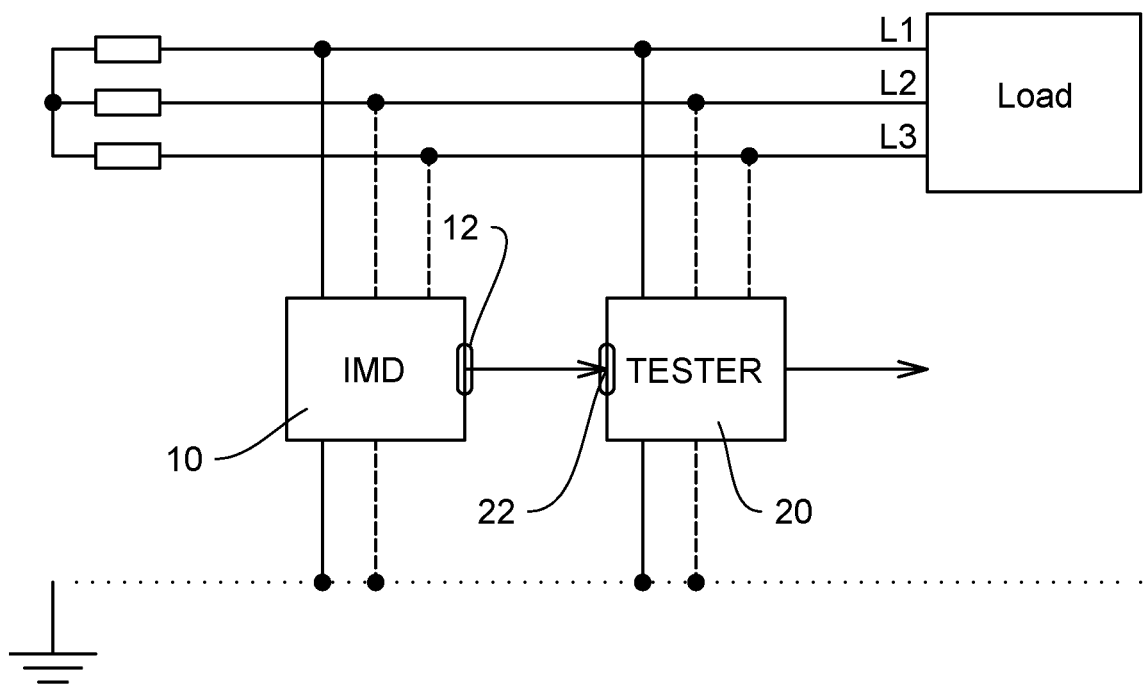

For this purpose, the testing apparatus 20 comprises a monitoring input 22 for monitoring the system alarm output 12 of the insulation monitoring device 10. The insulation monitoring device 10 as well as the testing apparatus 20 are connected to at least one active conductor (L+, L− or L1, L2, L3) of the ungrounded power supply system 2 which, as an example, is realized as a DC ungrounded power supply system having active conductors L+, L− (FIG. 3a) or as AC ungrounded power supply system having active conductors L1, L2, L3 (FIG. 3d). The AC ungrounded power supply system is only shown for the case of FIG. 3d, but it is also applicable in FIGS. 3b and 3c.

In a first embodiment according to FIG. 3a, the insulation monitoring device 10 is serially connected to the testing apparatus 20 via the system alarm output 12 of the insulation monitoring device 10 and via the monitoring input 22 of the testing apparatus 20. An alarm message queuing at the system alarm output 12 of the insulation monitoring device 10 is only passed on as an effective system alarm by the testing apparatus 20 if this alarm message was not triggered as a reaction in the scope of a function testing.

In the embodiment according to FIG. 3b, the alarm contacts of the system alarm output 12 of the insulation monitoring device 10 are added in series having alarm contacts 24 of the testing apparatus so that an open alarm contact 24 of the testing apparatus 20 can suppress a system alarm message of the insulation monitoring device 10, which was triggered by closing a "normally open" alarm contact 12.

In the embodiment according to FIG. 3c, the alarm contacts of the system alarm output 12 of the insulation monitoring device 10 are added parallel to the alarm contacts 24 of the testing apparatus so that a closed alarm contact 24 of the testing device 20 can suppress a system alarm message of the insulation monitoring device 10, which was triggered by opening a "normally closed" alarm contact 12.

The invention claimed is:

1. A method for testing the function of a standard insulation monitoring device (10), installed in an ungrounded power supply system, during operation, comprising:
(a) depositing the following in the testing apparatus (20): an internal resistance value (Ri) of the insulation monitoring device (10), a response value (Rres) set in the insulation monitoring device (10) and a maximum permissible response time (Tresmax) set in the insulation monitoring device (10),
and by a fully automated, perpetually running testing cycle, comprising the method steps:
(b) measuring an effective insulation resistance (Reff) via the testing apparatus (20), said effective insulation resistance (Reff) resulting from the internal resistance (Ri) of the active insulation monitoring device (10) and an insulation resistance (Riso) of the ungrounded power supply system arranged parallel thereto
(c) calculating an insulation resistance value (Rcal) of the ungrounded power supply system via the testing apparatus (20) from the measured effective insulation resistance value (Reff) and the deposited internal resistance value (Ri) of the insulation monitoring device (10),
(d) calculating a critical test fault resistance value Rf via the testing apparatus (20) while considering the calculated insulation resistance value (Rcal) of the ungrounded power supply system,
(e) adding the test fault resistance (Rf) between at least one of the active conductors of the ungrounded power supply system and ground via the testing apparatus (20) and simultaneously starting a time measuring device in the testing apparatus (20) for measuring a response time (Tres) of the insulation monitoring device (10),
(f) monitoring a system alarm output (12) of the insulation monitoring device (10) and measuring the response time (Tres) via the testing apparatus (20),
(g) starting a fault treatment via the testing apparatus (20), should the measured response time (Tres) exceed the maximum permissible response time (Tresmax),
(h) generating a result log and/or transmitting the test results to a management system, should the measured response time (Tres) not exceed the maximum permissible response time (Tresmax),
(i) removing the test fault resistance Rf via the testing apparatus (20).

2. The method according to claim 1, wherein one or more of the following actions can be executed by the testing apparatus (20) as a fault treatment: logging the fault; transmitting a fault message to a superordinate management system; dispatching a function alarm message; shutting down the power supply system.

3. The method according to claim 1, wherein by uncoupling the system alarm output (12) of the insulation monitoring device for providing an effective system alarm, a difference is made between an actual system alarm of the insulation monitoring device (10) and a test-related system alarm of the insulation monitoring device (10) in such a manner that the system alarm triggered by the insulation monitoring device (10) only becomes effective if the system alarm triggered by the insulation monitoring device (10) was not triggered by a testing cycle.

4. A testing apparatus (20) for testing the function of a standard insulation monitoring device (10), installed in an ungrounded power supply system, during operation, implementing a method according to claim 1, comprising:
- a controlling and computing unit having a storage device for implementing the fully automated, perpetually running testing cycle;
- a measuring device for measuring the insulation resistance effective in the ungrounded power supply system; a communication device for transmitting data; a switching device for adding the test fault resistance between the at least one active conductor of the ungrounded power supply system and ground; and a monitoring input (22) for monitoring the system alarm output (12) of the insulation monitoring device.

5. An insulation monitoring device (10) for monitoring an insulation resistance of an ungrounded power supply system, comprising:
  a testing apparatus (20) according to claim 4.

* * * * *